US012389805B2

(12) United States Patent
Li et al.

(10) Patent No.: US 12,389,805 B2
(45) Date of Patent: Aug. 12, 2025

(54) LAYERED STRUCTURE, MAGNETORESISTIVE DEVICE USING THE SAME, AND METHOD OF FABRICATING LAYERED STRUCTURE

(71) Applicant: National Institutes for Quantum Science and Technology, Chiba (JP)

(72) Inventors: Songtian Li, Chiba (JP); Seiji Sakai, Chiba (JP)

(73) Assignee: National Institutes for Quantum Science and Technology, Chiba (JP)

( * ) Notice: Subject to any disclaimer, the term of this patent is extended or adjusted under 35 U.S.C. 154(b) by 488 days.

(21) Appl. No.: 17/755,888

(22) PCT Filed: Oct. 21, 2020

(86) PCT No.: PCT/JP2020/039569
§ 371 (c)(1),
(2) Date: May 11, 2022

(87) PCT Pub. No.: WO2021/095468
PCT Pub. Date: May 20, 2021

(65) Prior Publication Data
US 2022/0384711 A1 Dec. 1, 2022

Related U.S. Application Data

(60) Provisional application No. 62/935,154, filed on Nov. 14, 2019.

(30) Foreign Application Priority Data

Mar. 24, 2020 (JP) .................. 2020-052726

(51) Int. Cl.
*H01L 29/82* (2006.01)
*H10B 61/00* (2023.01)
(Continued)

(52) U.S. Cl.
CPC ............. *H10N 50/80* (2023.02); *H10B 61/00* (2023.02); *H10N 50/01* (2023.02)

(58) Field of Classification Search
CPC ..... H10N 50/10; H10N 50/20; H01F 10/1936
See application file for complete search history.

(56) References Cited

U.S. PATENT DOCUMENTS 11,245,068 B2 * 2/2022 Lin ...................... H10N 50/85
2005/0073778 A1 * 4/2005 Hasegawa ............... C22C 19/05
360/324.11
(Continued)

FOREIGN PATENT DOCUMENTS

JP    2006-319234    11/2006
JP    2016-177689    10/2016
WO    2010/029702    3/2010

OTHER PUBLICATIONS

International Search Report for PCT/JP2020/039569 mailed on Dec. 15, 2020.
(Continued)

*Primary Examiner* — Kretelia Graham
*Assistant Examiner* — David J Goodwin
(74) *Attorney, Agent, or Firm* — IPUSA, PLLC

(57) ABSTRACT

A layered structure which achieves both high spin polarization and low electrical resistance is provided. The layered structure includes a Heusler alloy, and graphene that is in direct contact with the surface of the Heusler alloy. Such a layered structure is fabricated by forming a thin film of the Heusler alloy over a substrate under vacuum, and growing graphene on the surface of the thin film of the Heusler alloy while maintaining the vacuum.

7 Claims, 8 Drawing Sheets

(51) Int. Cl.
*H10N 50/01* (2023.01)
*H10N 50/80* (2023.01)

(56) References Cited

U.S. PATENT DOCUMENTS

| | | |
|---|---|---|
| 2009/0321860 A1 | 12/2009 | Klostermann et al. |
| 2009/0322319 A1* | 12/2009 | Kreupl .................. B82Y 10/00 324/252 |
| 2010/0109712 A1* | 5/2010 | Zaliznyak ........... H01F 10/3218 257/29 |
| 2011/0143460 A1 | 6/2011 | Tsunekawa et al. |
| 2015/0221596 A1* | 8/2015 | Ren .................. H01L 21/76843 438/643 |
| 2016/0276008 A1 | 9/2016 | Saida et al. |
| 2017/0242083 A1 | 8/2017 | van't Erve et al. |
| 2018/0240964 A1 | 8/2018 | Nikonov et al. |
| 2022/0081300 A1* | 3/2022 | Gao ........................ C23C 16/52 |

OTHER PUBLICATIONS

Written Opinion of the International Searching Authority for PCT/JP2020/039569 mailed on Dec. 15, 2020.
Karpan et al., "Graphite and Graphene as Perfect Spin Filters", Phys. Rev. Lett. 99, 176602 (2007).
Entani et al., "Precise control of single- and bi-layer graphene growths on epitaxial Ni(111) thin film", J. Appl. Phys. 6, 064324 (2012).
Entani et al., "Spin polarization of single-layer graphene epitaxially grown on Ni(111) thin film", Carbon 61, 134 (2013).
Li et al., "Enhancement of giant magnetoresistance by L21 ordering in Co2Fe(Ge0.5Ga0.5) Heusler alloy current-perpendicular-to-plane pseudo spin valves", Appl. Phys. Lett. 103, 042405 (2013).
Liu et al., "Atomic-Scale Interfacial Magnetism in Fe/Graphene Heterojunction", Sci. Rep. 5, 11911 (2015).

* cited by examiner

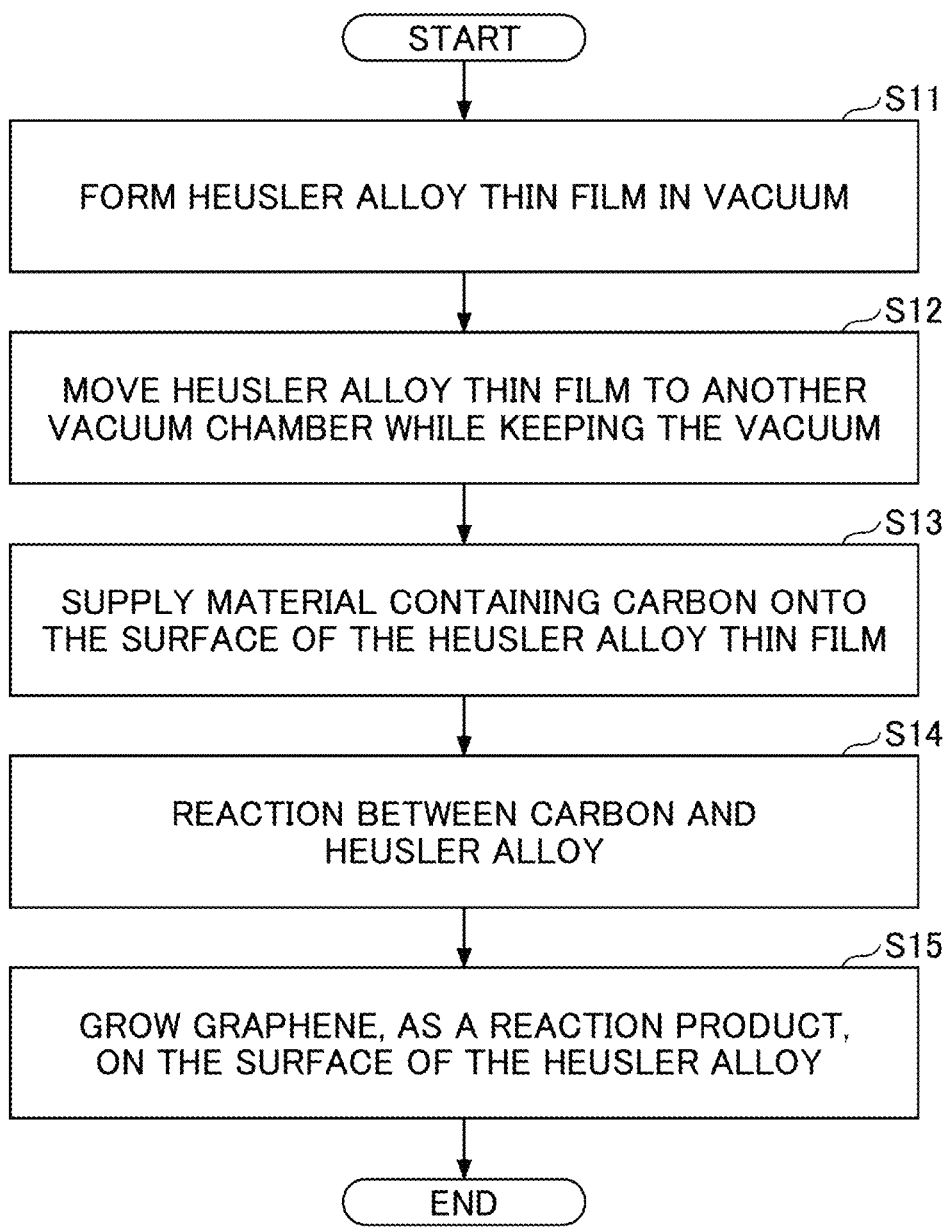

LAYERED STRUCTURE, MAGNETORESISTIVE DEVICE USING THE SAME, AND METHOD OF FABRICATING LAYERED STRUCTURE

TECHNICAL FIELD

The present invention relates to a layered structure, a magnetoresistive device using the same, and a method of fabricating a layered structure.

BACKGROUND ART

With the development of the information society, there has been a need for higher recording density in magnetic storages or memories. Currently used magnetic memories include magnetic tunnel junction (MTJ) devices with relatively high tunneling magnetoresistance ratios.

Meanwhile, graphene is a promising material that paves the way for advanced spintronic devices owing to its excellent electrical and physical properties. So far, studies have been made mainly on applications to current-in-plane (CIP) magnetoresistive devices which deal with in-plane spin transport in graphene channels. In recent years, development of current-perpendicular-to-plane (CPP) magnetoresistive devices, using graphene for spacer layers or tunnel barrier layers, has been attracting attention. Graphene-based CPP magnetoresistive devices exhibit a large magnetoresistance effect, with a low electrical resistance, and are expected to pave the way for the next-generation high-speed, low-power storage and memory technology. (See, for example, Non-Patent Document 1).

A method of enhancing spin injection into graphene is proposed (the above-described Non-Patent Document 1). In this method, a copper (Cu) film with a thickness of one to several atoms is inserted in a magnetic metal such as nickel (Ni) or cobalt (Co) when graphene grows on the surface of the magnetic metal, thereby improving the spin injection characteristic. Another method for controlling the graphene growth atmosphere to accurately control the number of graphene layers during chemical vapor deposition (CVD) on nickel has also been proposed. (See, for example, Non-Patent Document 2).

Heusler alloy is listed as an example of the ferromagnetic material used in a MTJ device, while graphene is described as an example of the electrode material. (See, for example, Patent Document 1).

PRIOR ART DOCUMENT(S)

Patent document(s) described above is(are):
Patent Document 1: JP Patent Application Laid-open Publication No. 2016-177689.
Non-Patent document(s) described above is(are):
Non-Patent Doc. 1: Karpan et al, Phys. Rev. Lett. 99, 176602 (2007),
Non-Patent Doc. 2: Entani et al, J. Appl. Phys. 6, 064324 (2012),
Non-Patent Doc. 3: Entani et al, Carbon 61, 134 (2013),
Non-Patent Doc. 4: Li et al, Appl. Phys. Lett. 103, 042405 (2013), and
Non-Patent Doc. 5: Liu et al, Sci. Rep. 5, 11911 (2015).

SUMMARY OF THE INVENTION

Technical Problems to be Solved

In a typical MTJ device, an insulating layer made of an electrically insulating material is used as a spacer layer or a tunnel barrier layer, and therefore, the electrical resistance of the device is high. If the thickness of the insulating layer is reduced for the purpose of reducing the electrical resistance, the uniformity in the quality and/or thickness of the oxide forming the insulating layer is degraded, and the magnetoresistance ratio will decrease. Due to this trade-off, existing MTJ devices are unable to satisfy the requirements for next-generation magnetic memory, namely, a high magnetoresistance ratio, which reflects the electron spin polarization, and the magnitude of electrical resistance or resistance-area product with respect to the spin-polarized current flow.

In the above-noted Non-Patent Document 1, the heterostructure of magnetic metal and graphene produces a spin filtering effect, but the electronic band structure of graphene significantly changes due to the chemical interaction at the interface between graphene and a ferromagnetic material. The change in the electronic band structure of graphene, that is, destruction of the Dirac cone structure (see, for example, the above-noted Non-Patent Document 3) results in the decreased spin filtering efficiency and magnetoresistance ratio.

One objective of the present invention is to provide a layered structure with high spin polarization and low electrical resistance, as well as a magnetoresistive device using such a layered structure and a method of fabricating the layered structure.

Technical Solution(s)

The embodiments disclosed below realize a layered structure of Heusler alloy and graphene. A Heusler alloy has the highest spin polarization among the known substances, and graphene has the smallest spin-orbit interaction and the lowest electrical resistance among the known substances.

According to the first aspect of the disclosure, a layered structure includes a Heusler alloy, and graphene that is in direct contact with the surface of the Heusler alloy.

According to the second aspect of the disclosure, a layered structure includes a first Heusler alloy layer, a second Heusler alloy layer, and a graphene layer provided between the first Heusler alloy layer and the second Heusler alloy layer.

According to the third aspect of the disclosure, a method of fabricating a layered structure includes
  forming a thin film of Heusler alloy on a substrate under a vacuum, and
  growing graphene on the surface of the thin film of the Heusler alloy while maintaining a vacuum.

Advantageous Effect of the Invention

A layered structure with high spin polarization and low electrical resistance, as well as a method of fabricating such a layered structure, are provided. A magnetoresistive device to which the layered structure of the present invention is applied can achieve high-density recording, based on a high magnetoresistance ratio and a low resistance-area product value required for the next-generation magnetic memories.

BRIEF DESCRIPTION OF DRAWINGS

FIG. 3 is a flowchart of a process of fabricating a graphene/Heusler alloy layered structure according to an embodiment;

EMBODIMENTS FOR IMPLEMENTING THE INVENTION

The embodiments provide a layered structure in which a Heusler alloy and graphene are in direct contact. Heusler alloys have high spin polarization. Graphene has a uniform thickness, low electrical resistance, and small spin-orbit interaction. Spin-orbit interaction is a factor that causes turbulence in the spin orientation.

The surfaces of Heusler alloys are easily oxidized, and no work for growing graphene directly on the surface of a Heusler alloy has been reported so far. In the above-noted Patent Document 1, graphene provided on the ferromagnetic layer is used as an example of the electrode material; however, there is no specific description about the process for forming the graphene electrode. In general, a mechanical transfer technique is employed to transfer graphene onto a ferromagnetic layer made of a Heusler alloy.

In contrast, graphene with a thickness of one atomic layer (i.e., single-layer graphene) or several atomic layers (i.e., multilayer graphene) is grown directly on the surface of a Heusler alloy according to the embodiment, and a layered structure having a high magnetoresistance ratio and a low resistance-area product value is achieved.

<Graphene/Heusler Alloy Two-Layer Structure>

Figure 1:
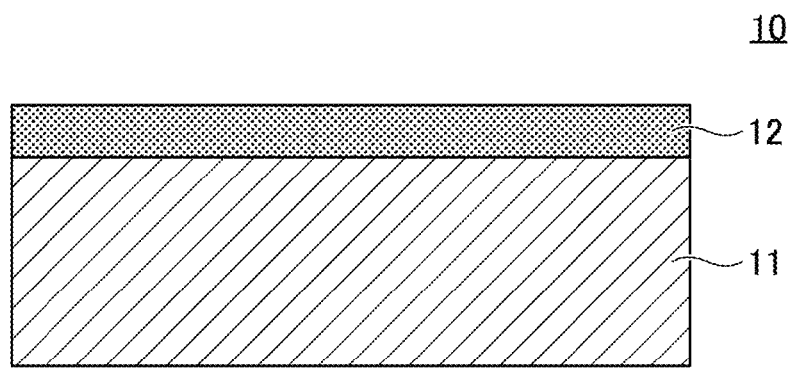
FIG. 1 is a schematic cross-sectional view of a layered structure according to an embodiment.

FIG. 1 is a schematic cross-sectional view of a layered structure 10 according to an embodiment. A layer of graphene 12, which is in direct contact with a Heusler alloy 11, is provided on the surface of the Heusler alloy 11. In this specification and the appended claims, the expression of Heusler alloy 11 and graphene 12 being "in direct contact" means that there is no intervening layer such as an oxide layer at the interface between the graphene 12 and the Heusler alloy 11, and that the graphene 12 and the Heusler alloy 11 are in physical contact with each other.

In other words, graphene 12 is the product of the chemical reaction between the Heusler alloy 11 and carbon, and grows directly on the surface of the Heusler alloy 11. The graphene 12 in the layered structure 10 of the embodiment is fundamentally different from a graphene layer arranged on the surface of the Heusler alloy 11 by a mechanical transfer technique. If a graphene layer is placed on the surface of the Heusler alloy 11 by a mechanical transfer technique, an intervening substance such as an oxide is inevitably present at the interface between the Heusler alloy 11 and the transferred graphene.

In the layered structure 10 of the embodiment, oxides or other intervening substances are not present at the interface between the Heusler alloy 11 and the graphene 12, and accordingly, a low electric resistance and a high magnetoresistance ratio can be achieved.

Heusler alloy has the highest conduction electron spin polarization among known substances because of its half-metallic characteristics, and shows a value close to 100% at room temperature. Thus, Heusler alloys are excellent in the performance of aligning the orientation of electron spin.

In one embodiment, among Heusler alloys, a full-Heusler alloy expressed by the general formula $X_2YZ$, where X and Y are transition metals and Z is a group 13-15 element, is used. Full-Heusler alloys have a crystal structure called an $L2_1$ structure in which four face-centered cubic (fcc) lattices are nested. Full-Heusler alloys are preferable because of high Curie temperatures and the half-metallic characteristics; however, half-Heusler alloys expressed by the general formula XYZ may also be used.

Half metals have both a metallic state and a semi-conductive state having a band gap, depending on the electron spin orientation. At the Fermi level, the electron spin orientations are completely aligned in one orientation, and the spin polarization ratio reaches 100%.

The metal element X may include Co, Ni, Ru, Rh, and other transition metals. For example, a Heusler alloy expressed by $Co_2YZ$ having a high Curie temperature and high spin polarization may be used. The metal element Y may be selected from V, Cr, Ti, Mn, Fe, and combinations thereof. The group 13-15 element Z may be selected from combinations of Al, Si, Ga, Ge, and Sn.

Examples of the $Co_2YZ$ combination include, but are not limited to $Co_2VAl$, $Co_2VSi$, $Co_2VGa$, $Co_2VGe$, $Co_2VSn$, $Co_2CrAl$, $Co_2CrSi$, $Co_2CrGa$, $Co_2CrGe$, $Co_2CrSn$, $Co_2TiAl$, $Co_2TiSi$, $Co_2TiGa$, $Co_2TiGe$, $Co_2TiSn$, $Co_2TiGe$, $Co_2TiSn$, $Co_2TiGe$, $Co_2TiSn$, $Co_2MnAl$, $Co_2MnSi$, $Co_2MnGa$, $Co_2MnGe$, $Co_2MnSn$, $Co_2TiAl$, $Co_2TiSi$, $Co_2TiGa$, $Co_2FeAl$, $Co_2FeSi$, $Co_2FeGa$, $Co_2FeGe$, $Co_2FeSn$, $Co_2FeGe_{1-x}Ga_x$, $Co_2MnGe_{1-x}Ga_x$, $Co_2FeA_{1-x}Si_x$, $Co_2Fe_{1-x}Mn_xSi$, $Co_2Mn_{1-x}Fe_xGe$, and $Co_2Fe_{1-x}Ti_xSi$ (0<x<1).

Graphene 12 is a sheet-like substance in which carbon (C) atoms are bonded to form a honeycomb network. The relationship between electron energy and momentum in the conduction and valence bands of graphene can be represented by a Dirac cone with symmetric cones with the vertices meeting at the Dirac points (point K or K' in the k-space). Graphene has low electrical resistance because it does not have a bandgap, and has high carrier mobility because of the Dirac cone. In addition, the spin-orbit interaction is the smallest among known substances, and spin scattering is unlikely to occur. Thus, graphene has excellent spin transport ability while maintaining the spin orientation.

Because of these characteristics, graphene can be used as the low-resistance spacer layer or tunnel barrier layer of a CPP-type magnetoresistive device.

Figure 2:
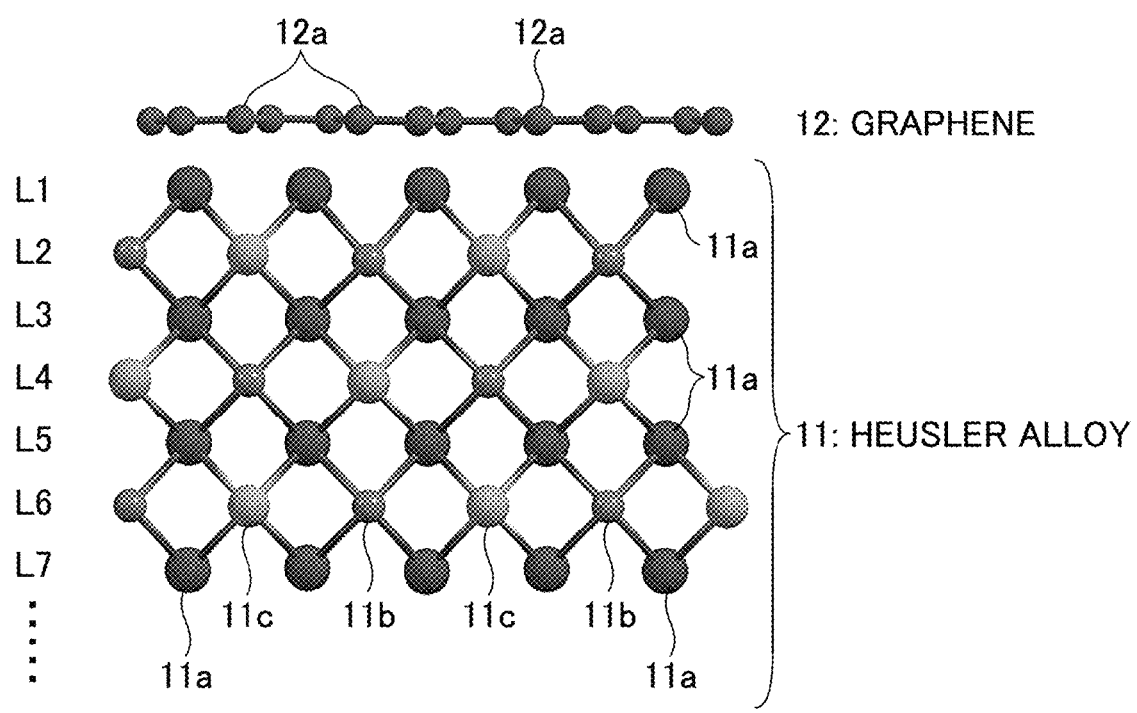
FIG. 2 is a schematic diagram of the cross-sectional atomic model of the graphene/Heusler alloy layered structure.

FIG. 2 is a schematic diagram of the cross-sectional atomic model of the graphene/Heusler alloy layered structure. Looking at the cross section of the (001)-oriented Heusler alloy 11 having the $L2_1$ structure from the side, layers (L1, L3, L5, . . . ) where X atoms 11a are located, and layers (L2, L4, . . . ) where Y atoms 11b and Z atoms 11c are located, are alternately present. The layer where the X atoms 11a are located and the layer where the Y atoms 11b and the Z atoms 11c are located may be reversed. Namely, the X atoms 11a may be located in layers L2, L4, . . . , while the Y atoms 11b and the Z atoms 11c may be located in layers L1, L3, L5, . . . .

With $Co_2FeGe_{1-x}Ga_x$ (0<x<1), Co is located in, for example, the odd-number layers (L1, L3, L5, . . . ), and Fe, Ge, and Ga are located in the even-number layers (L2, L4, . . . ).

Graphene 12 has a hexagonal lattice configured by covalently bonded C atoms 12a. One s-orbital and two p-orbitals of the C atom 12a are hybridized. One of the two electrons of the 2s orbital is excited to the 2p orbital, and the s-orbital, the px-orbital, and the py-orbital are oriented at an angle of 120 degrees with respect to each other in a plane. Graphene 12 having such a structure has a strong binding force in the in-plane direction.

Generally, when graphene is grown on a magnetic metal such as Ni or Co by a CVD method, a source gas containing hydrocarbon is supplied to the surface of the magnetic metal. However, Heusler alloys contain many kinds of elements and have a complicated crystal structure, unlike magnetic metals with a simple structure. For this reason, a layered structure in which graphene is grown directly on the surface of a Heusler alloy has never been reported.

The surface of a Heusler alloy is easily oxidized. Graphene does not grow on the surface of an oxidized Heusler alloy by a CVD method. Although a graphene film can be placed on the surface of the oxidized Heusler alloy using a mechanical transfer technique, a metal oxide film remains at the interface between the Heusler alloy and the graphene film. If such a layered structure with a metal oxide intervening between the graphene and the Heusler alloy is applied to an MTJ device, the graphene's excellent characteristic of low electrical resistance will be impaired.

In the embodiment, a thin film of a Heusler alloy and graphene are sequentially grown by using a sputtering method and a CVD method, while maintaining a high degree of vacuum.

FIG. 3 is a flowchart of a process of fabricating a graphene/Heusler alloy layered structure according to an embodiment. First, a thin film of a Heusler alloy is grown in vacuum (S11). In this specification and the appended claims, the term "under vacuum" or "in vacuum" means a high degree of vacuum state of $1\times10^{-4}$ Pa or less. For example, a thin film of the Heusler alloy is formed on a single crystal MgO (001) substrate by a sputtering method such as magnetron sputtering in a vacuum chamber with a vacuum degree of $1\times10^{-5}$ Pa or less, more preferably $1\times10^{-6}$ Pa or less. The thickness of the thin film of the Heusler alloy is, for example, 1 to 200 nm, preferably 10 to 100 nm.

In the present embodiment, the numerical range expressed by a dash (-) includes the numbers before and after the dash as the lower limit and the upper limit. The material of the substrate on which the Heusler alloy thin film is to be grown is not limited to MgO, and a $SiO_2$ substrate may be used in place of the MgO substrate. A thin film of metal, such as Ru, Ag, Cr, Ta, or NiAl alloy, may be formed on the substrate first, and then the Heusler alloy thin film may be grown using the thin metal film as the buffer layer.

With the Heusler alloy thin film with a thickness less than 1 nm, the characteristics of the Heusler alloy, including ferromagnetism and high spin polarization, may not be fully exhibited. If the thickness of the Heusler alloy thin film exceeds 200 nm, it may be difficult to reduce the size and the thickness of the device to which the layered structure 10 is applied.

In one example, a thin film of $Co_2FeGe_{0.5}Ga_{0.5}$ (hereinafter abbreviated as "CFGG") is formed on the single crystal MgO (001) substrate, using a base material or a target having a stoichiometric composition ratio of $Co_2FeGe_{0.5}Ga_{0.5}$. CFGG has the highest spin polarization among Heusler alloys. The pressure of Ar gas is set to 0.5 Pa to 1 Pa, the substrate temperature is 500° C. to 650° C., and the power is set to 10-60 W. By the magnetron sputtering, a single crystal CFGG thin film with the crystal orientation of (001) is formed.

Then, the CFGG thin film is moved to the second vacuum chamber, while the CFGG thin film is kept in the vacuum (S12). In order to maintain high degree of vacuum, an in-line film deposition system having multiple vacuum chambers connected in series in a sealed state may be used.

Then, graphene is grown directly on the CFGG thin film by a CVD technique in the second vacuum chamber. The degree of vacuum in the second vacuum chamber is $1\times10^{-5}$ Pa or less, more preferably $1\times10^{-6}$ Pa or less.

A source gas containing a hydrocarbon as the source material of graphene is supplied onto the surface of the Heusler alloy thin film (S13). Examples of the hydrocarbon include, but are not limited to ethane ($CH_4$), ethylene ($C_2H_4$), acetylene ($C_2H_2$), benzene ($C_6H_6$), toluene ($C_6H_5CH_3$), and methanol ($CH_3OH$). The pressure of the source gas is 1 Pa or less.

While the source gas is supplied, carbon reacts with the CFGG under the temperature control such that the substrate temperature is kept in the range of 500° C. to 650° C. (S14), whereby a graphene film is formed as the product of the chemical reaction directly on the CFGG thin film (S15). At a substrate temperature exceeding 650° C., the flatness of the CFGG thin film is impaired, and the uniformity of the growing graphene is degraded. At a substrate temperature lower than 500° C., the CFGG thin film does not exhibit the $L2_1$ structure required for inducing half metallic properties. In other words, the substrate temperature of 500° C. is the lower limit temperature for the Heusler alloy CFGG to transform into the $L2_1$ structure required for the onset of half-metallicity.

By supplying the source gas into the second vacuum chamber (i.e., onto the CFGG thin film) under the conditions of $1\times10^4$ L to $1\times10^5$ L (where 1 Langmuir (L) equals $1.33\times10^{-4}$ Pa*sec), a single-layer graphene is formed on the CFGG thin film with a coverage of 100%. By maintaining the vacuum in this way and performing CVD on the single crystal CFGG thin film, a high quality single-layer graphene can be obtained with complete coverage.

With the fabrication method shown in FIG. 3, graphene can be formed directly on the thin film of a Heusler alloy, without producing an oxide or other compounds at the interface. Because graphene is grown on the surface of the Heusler alloy thin film by CVD under a vacuum, a large-area graphene/Heusler alloy layered structure can be fabricated on a substrate or a wafer with an arbitrary size and shape. In addition, the surface of the fabricated graphene/Heusler alloy layered structure is completely covered with stable graphene, and the Heusler alloy is not oxidized even after the layered structure is placed in the atmosphere. These facts suggest simplicity of applications of the layered structure to large-scale integrated devices and practical materials.

<Evaluation of Graphene/CFGG Layered Structure>

Figure 4A:
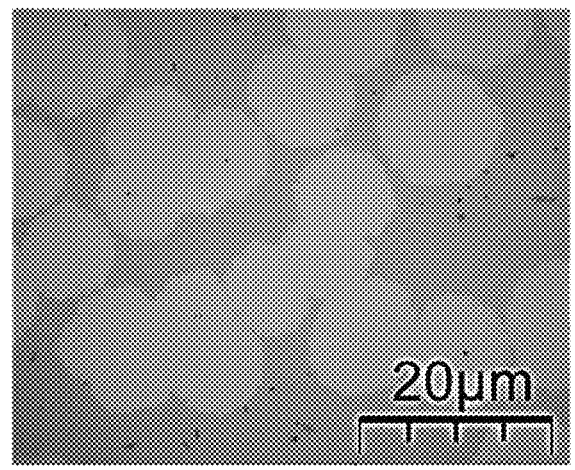
FIG. 4A is an optical microscope image showing the growth of graphene on a Heusler alloy (CFGG thin film) under a certain degree of exposure or quantity of source gas supply for graphene growth.

FIG. 4A is an optical microscope image in which graphene partially covers the surface of the Heusler alloy. The bright portion in the bright/dark contrast represents the area covered with graphene, and the dark portion represents the CFGG surface that is not covered with graphene. This bright/dark contrast is not observed from the graphene/CFGG layered structure as long as it is maintained under a vacuum. By heating the graphene/CFGG layered structure in the air or the oxygen atmosphere, only the area where the CFGG surface is exposed without being covered with graphene is oxidized, and the color of the oxidized portion changes to create a contrast.

Figure 4B:
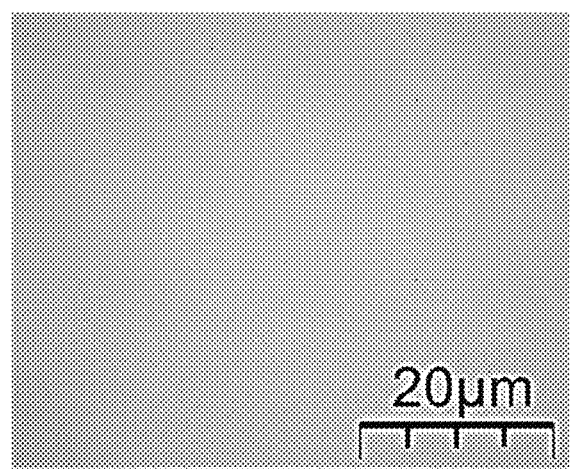
FIG. 4B is an optical microscope image showing the growth of graphene on the Heusler alloy (CFGG thin film) under a greater degree of exposure or quantity of source gas supply for graphene growth.

FIG. 4B is an optical microscope image in which the surface of the CFGG thin film is completely covered with graphene. The CVD graphene growth rate varies greatly depending on the thickness of graphene. By appropriately controlling the source gas supply conditions, such as the flow rate of or the exposure amount to the source gas containing the source material of graphene, a single-layer graphene can be uniformly formed with a coverage of 100%. By increasing the amount of exposure, a multilayer graphene with a thickness of several layers can be formed.

Figure 5:
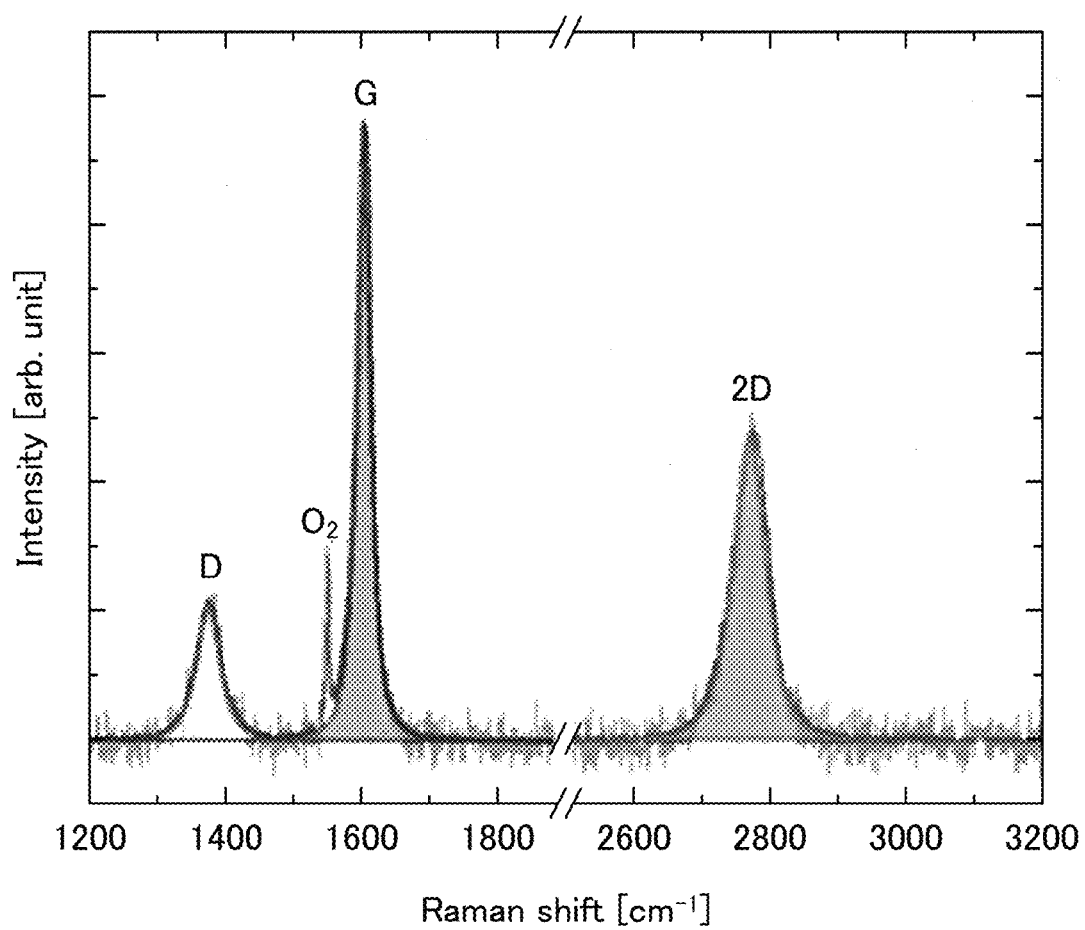
FIG. 5 shows a Raman spectrum of the layered structure of the embodiment.

FIG. 5 shows a Raman spectrum of the layered structure according to the embodiment. Graphene-specific Raman peaks (D-band, G-band, and 2D-band) appear in the spectrum. The small intensity of the defect-induced D band peak, compared with the G-band peak, suggests a high crystal quality of the single-layer graphene formed on the CFGG thin film.

The area intensity ratio of the 2D band to the G band (I(2D)/I(G)) is found to be nearly equal to 1.1. This indicates that the single-layer graphene receives a charge doping effect stemming from CFGG.

Figure 6A:
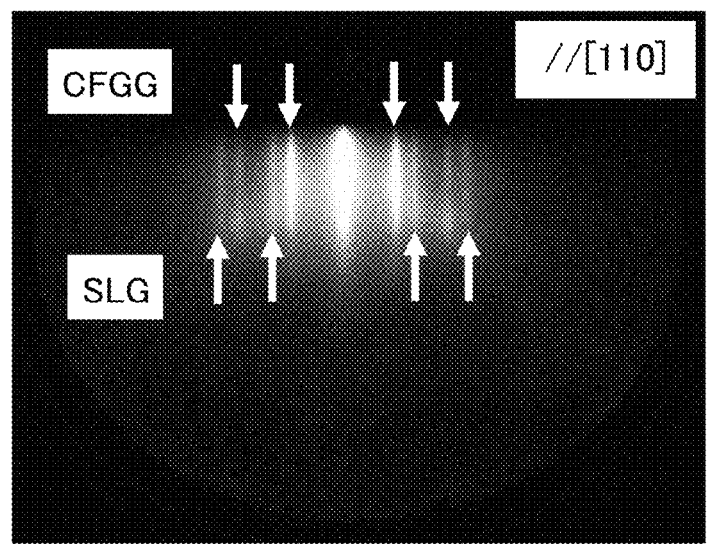
FIG. 6A is a reflection high energy electron diffraction (RHEED) image of the layered structure of the embodiment.
Figure 6B:
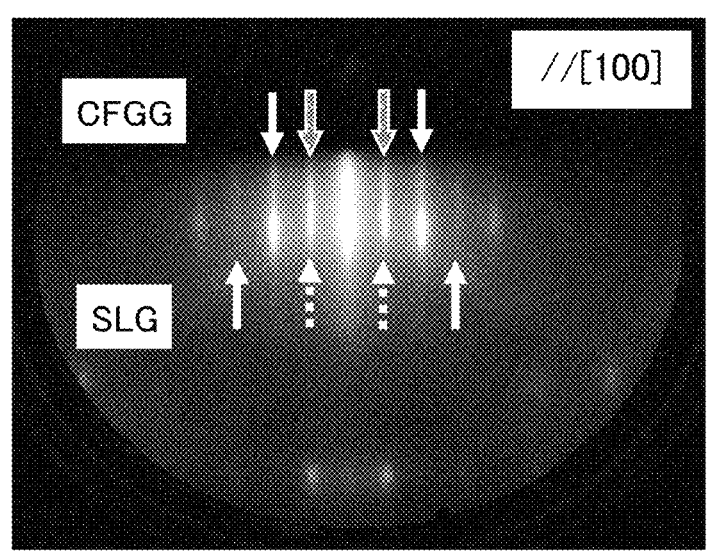
FIG. 6B is a RHEED image of the layered structure of the embodiment obtained at a different incident angle of an electron beam.

FIG. 6A and FIG. 6B are RHEED images of the layered structure 10 of the embodiment. The image of FIG. 6A is obtained at an incident angle of an electron beam parallel to the [110] direction of the MgO substrate, and the image of FIG. 6B is obtained at an incident angle of an electron beam parallel to the direction of the MgO substrate.

In FIG. 6A and FIG. 6B, the downward white arrows denote the reflection pattern from CFGG, and the upward white arrows denote the diffraction pattern from single-layer graphene (labelled as "SLG" in the figure). The sharp striped diffraction and reflection patterns obtained from graphene and CFGG confirm that graphene grows directly on the CFGG thin film, and that the interface between CFGG and graphene is flat at the atomic level.

If an oxide film is present between the Heusler alloy and graphene, the RHEED pattern from the Heusler alloy is not observed. It is easily confirmed that there is absence of oxides at the interface between the Heusler alloy and graphene, by examining the RHEED pattern from the layered structure.

In FIG. 6B, the downward gray arrows denote the ½-order superlattice diffraction of CFGG caused by the $L2_1$ crystal phase of CFGG. This superlattice diffraction shows that the crystal structure associated with the half-metallic property of CFGG is sufficiently maintained even near the interface between graphene and CFGG.

From the RHEED images of FIG. 6A and FIG. 6B, the lattice constant of CFGG near the interface with graphene is evaluated to be 0.57 nm. This is in good agreement with the evaluation result of the lattice constant (0.574 nm) of the entirety of the CFGG thin film estimated by X-ray diffraction (XRD).

In FIG. 6B, the upward dashed arrows of SLG indicate that the diffraction line of the single-layer graphene overlaps the CFGG diffraction. Unlike the CFGG diffraction, the diffraction pattern and intensity from graphene do not exhibit a clear dependence on the incident angle of an electron beam. This fact shows the random in-plane orientation of the graphene hexagonal lattice with respect to the (001) plane of CFGG.

The randomness of the in-plane orientation of graphene crystals (i.e., polycrystalline structure) reflects the weak bond between graphene and the CFGG (001) plane. Such a random in-plane orientation does not affect the electronic properties of graphene (namely, high electron mobility and efficient spin current transmission explained by zero bandgap and Dirac cone), because the bond between graphene and CFGG is due to weak van der Waals interaction.

The lattice constant of the single-layer graphene grown in the embodiment is estimated to be 0.25 nm from the RHEED image. This is consistent with the in-plane lattice constant of graphite (0.246 nm).

In this way, high quality graphene can be acquired with 100% coverage by growing graphene on the CFGG thin film by a CVD technique, while maintaining the vacuum.

<Magnetic Characteristics at SLG/CFGG Interface>

Figure 7A:
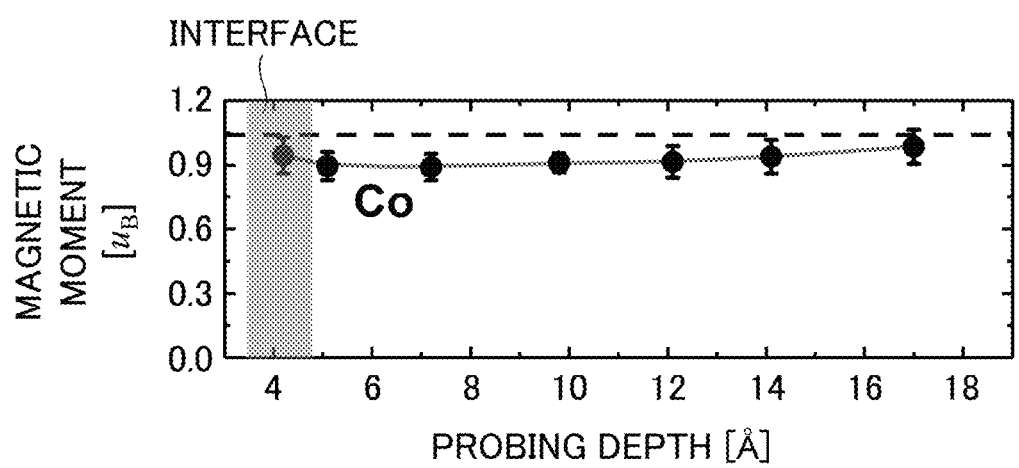
FIG. 7A shows the depth dependence of the magnetic moment of a constituent element (Co) of the Heusler alloy (CFGG thin film) in the layered structure of the embodiment, with respect to the position of the graphene surface of the layered structure.
Figure 7B:
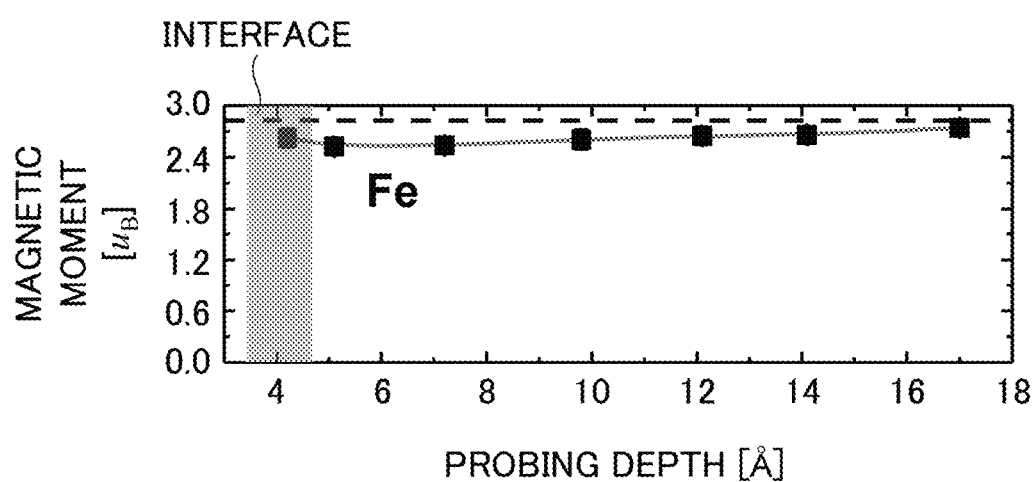
FIG. 7B shows the depth dependence of the magnetic moment of a constituent element (Fe) of the Heusler alloy (CFGG thin film) in the layered structure of the embodiment, with respect to the position of the graphene surface of the layered structure.

FIG. 7A and FIG. 7B show the depth dependence of the magnetic moment of the CFGG thin film in the layered structure 10 of the embodiment. FIG. 7A shows the depth dependence of the magnetic moment of Co atom in CFGG, and FIG. 7B shows the depth dependence of the magnetic moment of Fe atom in CFGG. The magnetic moment is an index showing the strength of magnetism.

The magnetism at the interface region between graphene and CFGG can be analyzed by depth-resolved X-ray magnetic circular dichroism (DR-XMCD) spectroscopy. XMCD represents the difference in X-ray absorption spectral intensities in a magnetized sample measured with left circular polarization and right circular polarization.

The magnetic moments of Co and Fe at each depth are the sum of the magnetic moment and the orbital magnetic moment of the respective elements. The gray region is the interface region where the CFGG thin film is in contact with graphene. The numerical values on the horizontal axis represent the depth from the graphene located on the top of the layered structure. For both Co and Fe, the magnitude of the magnetic moment is almost the same as that of the internal magnetic moment of the thin film indicated by the dashed lines, over the range from the interface to the depth of 1.7 nm, which is far from the interface with the graphene.

Although the magnetic moment slightly decreases in the region of 0.5 nm to 0.7 nm in the depth direction, such a change in the magnetic moment is within only 10% of the internal magnetic moment of the thin film.

The fact that the magnitude of the magnetic moment is maintained over the entire graphene/CFGG interface even inside the thin film of the layered structure 10 (that is, the magnetic uniformity in the film thickness direction) is a significant difference from the conventional graphene/magnetic metal heterostructure described in, for example, Non-Patent Document 5.

Figure 8:
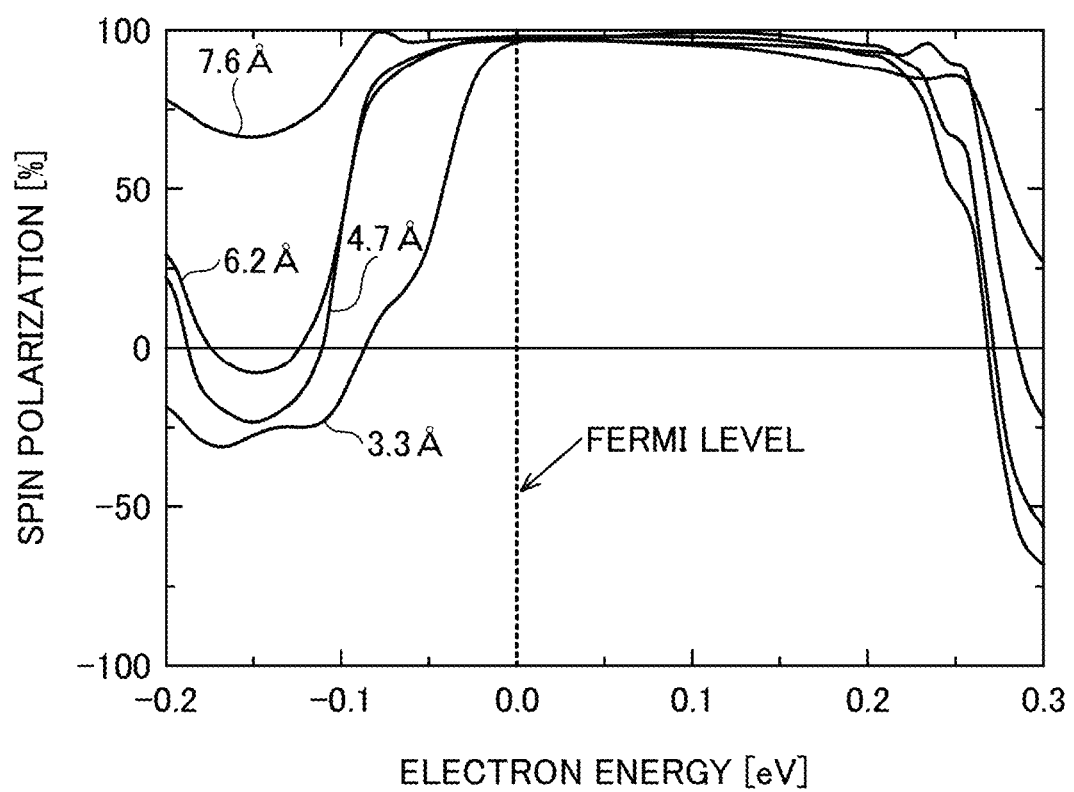
FIG. 8 shows spin polarizations of the Heusler alloy (CFGG thin film) at the respective depths from the position of the graphene surface of the layered structure.

FIG. 8 shows spin polarizations of the Heusler alloy (CFGG thin film) at the respective depths from the reference position of the graphene surface of the layered structure. The spin polarizations in FIG. 8 are predicted values obtained by theoretical calculation based on experimental results using depth-resolved X-ray magnetic circular dichroism spectroscopy. The horizontal axis represents electron energy (eV), and the vertical axis represents spin polarization (%). The "0.0 eV" point on the horizontal axis indicates the Fermi level. One hundred percent (100%) spin polarization is achieved at depths of 0.33 nm (3.3 Å), 0.47 nm (4.7 Å), 0.62 nm (6.2 Å), and 0.76 nm (7.6 Å), respectively. The calculation result of FIG. 8 is obtained based on the density of states of electron orbitals in the interface region using a sample with the uppermost layer of Co atoms in contact with graphene. Even with a sample having the uppermost layer consisting of Fe, Ge, and Ga atoms in contact with graphene, satisfactory spin polarization can be achieved up to the vicinity of the interface.

<3-Layered Heusler Alloy/Graphene/Heusler Alloy>

Figure 9:
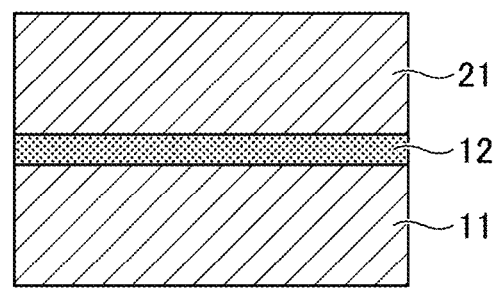
FIG. 9 is a schematic diagram of a layered structure according to another embodiment.

FIG. 9 is a schematic diagram of a layered structure 20 according to another embodiment. The layered structure 20 has a three-layer structure of a Heusler alloy/graphene/Heusler alloy. In the stacking direction, a single-layer or multilayer graphene 12 is provided between a Heusler alloy 11 and a Heusler alloy 21.

By sandwiching the graphene layer between two Heusler alloy layers, the layered structure 20 can achieve both high spin polarization and low electrical resistance. In the stacking direction, at least the Heusler alloy 11 and the graphene 12 are in direct contact with each other. The graphene 12 and the Heusler alloy 21 may also be in direct contact with each other.

In order to directly grow the Heusler alloy 21 on the graphene 12, the sample is moved to the Heusler alloy deposition chamber, while maintaining the vacuum, after step S15 of FIG. 3. If the thin film of the Heusler alloy 21 is formed with the same composition as the Heusler alloy 11, the transfer mechanism may be driven so as to bring the sample back to the first chamber. If the thin film of the Heusler alloy 21 is formed with a composition different from that of the Heusler alloy 11, another film deposition chamber may be connected in series so as to be kept in vacuum.

The three-layer layered structure 20 of FIG. 9, as well as the two-layer layered structure 10, is applicable to a magnetoresistive device. In this application, the graphene 12 serves as a spacer layer or a tunnel barrier layer. Unlike the conventional device structures with tunnel barrier layers formed of insulating materials, graphene has low electrical resistance and low spin-orbit interaction. In addition, good magnetism and half metallic characteristics of the Heusler alloy can be maintained at the graphene/Heusler alloy interface. From these facts, applications of the layered structure 20 to magnetoresistive devices can achieve both a high magnetoresistance ratio and a low resistance-area product value.

<Application to Magnetoresistive Device>

Figure 10:
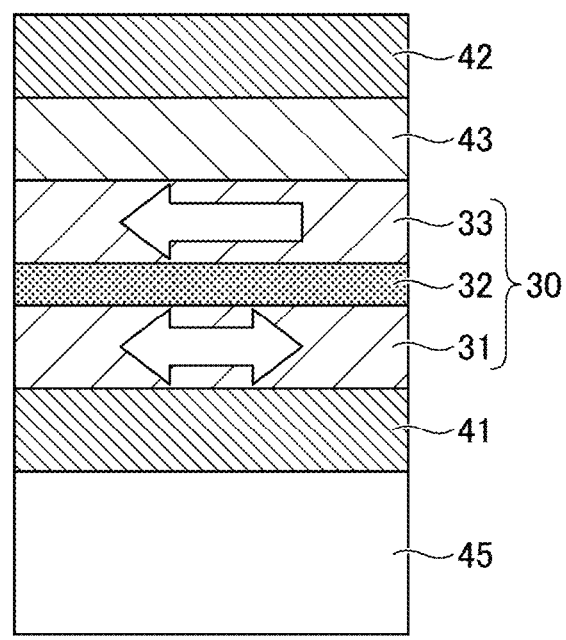
FIG. 10 is a schematic diagram of a magnetoresistive device using the layered structure of FIG. 8.

FIG. 10 is a schematic diagram of a magnetoresistive device 100 using a layered structure 30 according to an embodiment. A first conductive layer 41, a layered structure 30, an antiferromagnetic layer 43, and a second conductive layer 42 are provided in this order on a substrate 45.

In the layered structure 30, a first Heusler alloy layer 31, a graphene layer 32, and a second Heusler alloy layer 33 are provided in this order. The graphene layer 32 is sandwiched between the first Heusler alloy layer 31 and the second Heusler alloy layer 33, both of which are ferromagnets, and the graphene layer 32 serves as a spacer layer or a tunnel barrier layer.

More specifically, the spacer layer is supposed to be a layer sandwiched between a pair of ferromagnetic layers, in which an electric current flows between the ferromagnetic layers passing through the spacer layer (so that electrons move inside the spacer layer). On the other hand, the tunnel barrier layer is supposed to be a layer sandwiched between a pair of ferromagnetic layers, in which electrons (or electric current) do not physically pass through the tunnel barrier layer, but move between the ferromagnetic layers by the tunneling effect. The graphene layer 32 exemplified in FIG. 10 can serve as either the spacer layer or the tunnel barrier layer depending on the combination of the thickness of the graphene layer 32 and the magnetic materials constituting the first and second Heusler alloy layers 31 and 33.

The first Heusler alloy layer 31 is, for example, a free layer or a recording layer in which the magnetization direction is changeable, as indicated by the double-pointed arrow in FIG. 10. The second Heusler alloy layer 33 is a pinned layer or a reference layer in which the magnetization direction is pinned, as indicated by the left arrow in FIG. 10.

The antiferromagnetic layer 43 has antiferromagnetic properties in which the magnetic moments of atoms composing the crystal are arranged so as to cancel each other. The antiferromagnetic layer 43 does not have spontaneous magnetization as a whole.

The magnetization of the second Heusler alloy layer 33, which is in contact with the antiferromagnetic layer 43, is in exchange coupling with the antiferromagnetic layer 43, and it is difficult for the magnetization of the second Heusler layer 33 to turn to the direction of the applied magnetic field having an applicable magnitude. In contrast, the magnetization of the first Heusler alloy layer 31, which is located on one side of the graphene layer 12 serving as the spacer layer opposite to the second Heusler alloy layer 33, changes depending on the direction of the current or the magnetic field.

The first conductive layer 41 and the second conductive layer 42 serve as electrodes. By switching the direction of the current applied between the first conductive layer 41 and the second conductive layer 42, the magnetization direction of the first Heusler alloy layer 31 is changed, and the digital information "0" and "1" can be recorded.

The information corresponding to "0" and "1" can be read out by detecting the change in electrical resistance depending on the relative direction of magnetization (parallel or antiparallel) between the first Heusler alloy layer 31 and the second Heusler alloy layer 33. When the magnetization directions of the first Heusler alloy layer 31 and the second Heusler alloy layer 33 are aligned (parallel), the resistance is small. When the magnetization directions of the first Heusler alloy layer 31 and the second Heusler alloy layer 33 are opposite to each other (antiparallel), the resistance is large.

By using the layered structure 30 of the embodiment, high spin polarization is maintained even at or near the interface between the Heusler alloy layer and graphene (see FIG. 8). A unique electronic band structure called a Dirac cone is maintained in the graphene layer 32, which serves as a spacer layer or a tunnel barrier layer. Because of the high electron mobility and reduced spin-orbit interaction, efficient spin current transmission is achieved.

The value of the resistance-area product of the magnetoresistive device using graphene for the spacer layer or tunnel barrier layer is expected to be about $10^{-2}$ $\Omega\mu m^2$ or higher when the graphene thickness is one atomic layer. It is also expected that the resistance-area product value can be controlled to the range required for the magnetoresistive device of the next-generation high-recording-density magnetic memory (about $10^{-2}$ to $10^2$ $\Omega\mu m^2$) by adjusting the thickness of graphene in the range of 1 to 4 atomic layers.

The magnetoresistive device 100 can be applied to a hard disk drive, a magnetic random access memory (MRAM), or other magnetic storages or memories. These magnetic memories can store a huge amount of information, while consuming less power, by making use of the electron's magnetic property (spin).

The present invention is not limited to the above-described configurations. The Heusler alloy may be formed by bipolar sputtering or vacuum deposition, in addition to magnetron sputtering. Graphene may be formed on a Heusler alloy by a physical vapor deposition (PVD) method by depositing atomic carbon or carbon clusters such as fullerenes produced by sputtering or pulsed laser irradiation, instead of the CVD method. The conditions for the film deposition of Heusler alloy can be appropriately adjusted depending on the composition, film thickness, and other factors. For the Heusler alloy, not only full Heusler alloys with the $L2_1$ structure, but also half-Heusler alloys expressed by the general formula XYZ may be used. Again, graphene can be grown directly on the surface of such half-Heusler alloy under a vacuum. Some half-Heusler alloys exhibit half-metallic properties, and have spin polarization higher than typical magnetic metals.

This PCT International application is based upon and claims priorities to earlier U.S. provisional patent application No. 62/935,154 filed Nov. 14, 2019, and earlier Japanese Patent Application No. 2020-052726 filed Mar. 24, 2020, the entireties of which are incorporated herein by reference.

LIST OF REFERENCE SYMBOLS

10, 20, 30 layered structure
11, 21 Heusler alloy
12 graphene
31 first Heusler alloy layer
32 graphene layer
33 second Heusler alloy layer
41 first conductive layer
42 second conductive layer
43 antiferromagnetic layer
45 substrate
100 magnetoresistive device

What is claimed is:

1. A method of fabricating a layered structure comprising;
forming a thin film of a Heusler alloy over a substrate under a vacuum;
growing a single layer of graphene on a surface of the thin film of the Heusler alloy without an oxide layer between the thin film of Heusler alloy and the single layer of graphene, while maintaining the vacuum,
forming the thin film of the Heusler alloy in a first vacuum chamber;
moving the substrate over which the thin film of the Heusler alloy has been formed to a second vacuum chamber while maintaining the vacuum; and
growing the single layer of graphene in the second vacuum chamber,
wherein the single layer of graphene is grown by supplying a source material into the second vacuum chamber under the conditions of $1 \times 10^4$ L to $1 \times 10^5$ L, where 1 Langmuir (L) represents $1.33 \times 10^{-4}$ Pa*sec.

2. The method as claimed in claim 1, comprising:
supplying a source material containing carbon onto the surface of the thin film of the Heusler alloy; and
growing the single layer of graphene on the surface of the thin film of the Heusler alloy by reaction of the carbon with the Heusler alloy.

3. The method as claimed in claim 1,
wherein the single layer of graphene is grown by chemical vapor deposition or physical vapor deposition.

4. The method as claimed in claim 1,
wherein the single layer of graphene is grown in a state where the temperature of the substrate is in a range of 500° C. to 650° C.

5. The method as claimed in claim 1,
wherein the thin film of the Heusler alloy is grown in the first vacuum chamber under a vacuum degree of $1 \times 10^{-5}$ Pa or less.

6. The method as claimed in claim 1,
wherein the single layer of graphene is grown in the second vacuum chamber under a vacuum degree of $1 \times 10^{-5}$ Pa or less.

7. The method as claimed in claim 5,
wherein the single layer of graphene is grown in the second vacuum chamber with a vacuum degree of $1 \times 10^{-5}$ Pa or less.

* * * * *